(12) United States Patent
Shishido et al.

(10) Patent No.: US 8,207,512 B2
(45) Date of Patent: *Jun. 26, 2012

(54) CHARGED PARTICLE BEAM APPARATUS AND METHODS FOR CAPTURING IMAGES USING THE SAME

(75) Inventors: Chie Shishido, Yokohama (JP); Mayuka Oosaki, Yokohama (JP); Mitsugu Sato, Hitachinaka (JP); Hiroki Kawada, Tsuchiura (JP); Tatsuya Maeda, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 12/898,455

(22) Filed: Oct. 5, 2010

(65) Prior Publication Data

US 2011/0133080 A1 Jun. 9, 2011

Related U.S. Application Data

(63) Continuation of application No. 11/647,348, filed on Dec. 29, 2006, now Pat. No. 7,807,980.

(30) Foreign Application Priority Data

Jan. 13, 2006 (JP) ................................. 2006-005482

(51) Int. Cl.
*G21K 7/00* (2006.01)
*A61N 5/00* (2006.01)
*G21G 5/00* (2006.01)

(52) U.S. Cl. ............. 250/492.1; 250/492.2; 250/492.21; 250/492.3; 382/154

(58) Field of Classification Search .................. 250/306, 250/307, 309, 310, 492.1, 492.2, 492.21, 250/492.23, 492.3; 382/154
See application file for complete search history.

(56) References Cited

U.S. PATENT DOCUMENTS 7,067,808 B2 6/2006 Kochi et al.
(Continued)

FOREIGN PATENT DOCUMENTS

JP 2004-127930 4/2004
(Continued)

OTHER PUBLICATIONS

A. Miyamoto et al., "Development of Beam-Tilt Angle Calibration Technique for CD-SEM", Collected papers of View 2004 vision technology application workshop lecture, pp. 48-53.

*Primary Examiner* — Bernard E Souw
(74) *Attorney, Agent, or Firm* — Antonelli, Terry, Stout & Kraus, LLP.

(57) ABSTRACT

The present invention provides a charged particle beam apparatus used to measure micro-dimensions (CD value) of a semiconductor apparatus or the like which captures images for measurement. For the present invention, a sample for calibration, on which a plurality of polyhedral structural objects with known angles on surfaces produced by the crystal anisotropic etching technology are arranged in a viewing field, is used. A beam landing angle at each position within a viewing field is calculated based on geometric deformation on an image of each polyhedral structural object. Beam control parameters for equalizing the beam landing angle at each position within the viewing field are pre-registered. The registered beam control parameters are applied according to the position of the pattern to be measured within the viewing field when performing dimensional measurement. Accordingly, the present invention provides methods for reducing the variation in the CD value caused by the variation in the electron beam landing angle with respect to the sample with an equal beam landing angle and methods for reducing the instrumental error caused by the difference in the electron beam landing angle between apparatuses.

8 Claims, 19 Drawing Sheets

U.S. PATENT DOCUMENTS

| | | | |
|---|---|---|---|
| 7,170,593 B2 * | 1/2007 | Honda et al. | 356/237.1 |
| 7,807,980 B2 * | 10/2010 | Shishido et al. | 250/492.1 |
| 2004/0264764 A1 * | 12/2004 | Kochi et al. | 382/154 |
| 2005/0133718 A1 * | 6/2005 | Miyamoto et al. | 250/307 |
| 2005/0161601 A1 * | 7/2005 | Kochi et al. | 250/311 |
| 2006/0038986 A1 * | 2/2006 | Honda et al. | 356/237.1 |
| 2007/0164219 A1 | 7/2007 | Shishido et al. | |

FOREIGN PATENT DOCUMENTS

JP  2005-183369  7/2005

* cited by examiner (a)

(b)

$$\phi_x = P \cdot r \cos(\alpha - Q)$$

$$\phi_y = P \cdot r \sin(\alpha - Q)$$

··· (Formula 1)

where $r = \sqrt{(x - dx)^2 + (y - dy)^2}$, $\alpha = \tan^{-1}((y - dx) / (x - dx))$ (a)

θ : tilt angle of side wall
φ : electron beam landing angle (b)

(c)

(a)

(b)

| Pyramid No. | x coordinate (pixels) | y coordinate (pixels) | x coordinate (nm) | y coordinate (nm) |
|---|---|---|---|---|
| 0, 0 | | | | |
| 1, 0 | | | | |
| 2, 0 | | | | |
| ⋮ | | | | |
| 0, 1 | | | | |
| 1, 1 | | | | |
| 2, 1 | | | | |
| ⋮ | | | | |
| i, j | | | | |

(a)

(b)

(a)

(b)

(a)

(b)

(a)

(b)

(a)

(b)

(a)

(b)

(a)

(b)

| Pyramid No. | Before calibration | | After calibration | |
|---|---|---|---|---|
| | $\phi_x$ | $\phi_y$ | $\phi_x$ | $\phi_y$ |
| 1 | | | | |
| 2 | | | | |
| 3 | | | | |
| 4 | | | | |
| ⋮ | ⋮ | ⋮ | ⋮ | ⋮ |
| 61 | | | | |
| 62 | | | | |
| 63 | | | | |
| 64 | | | | |

CHARGED PARTICLE BEAM APPARATUS AND METHODS FOR CAPTURING IMAGES USING THE SAME

CROSS REFERENCE TO RELATED APPLICATION

This application is a Continuation of U.S. application Ser. No. 11/647,348, filed Dec. 29, 2006 now U.S. Pat. No. 7,807,980, which claims priority from Japanese Patent Application No. JP 2006-005482, filed on Jan. 13, 2006, the contents of which are incorporated herein by reference.

BACKGROUND OF THE INVENTION

The present invention relates to a charged particle beam apparatus which measures micro-dimensions, such as circuit patterns of a semiconductor apparatus. More particularly, the present invention is concerned with a method for capturing images through measuring and adjusting an electron beam landing angle with respect to a sample and also concerned with the charged particle beam apparatus.

A CD-SEM (critical dimension scanning electron microscope) designed specifically for semiconductor is used for pattern dimension management in a semiconductor manufacturing process. The principle of the CD-SEM is shown in FIG. 2. A primary electron beam emitted from an electron gun is thinly converged by a convergence lens, and the thus converged electron beam two-dimensionally scans a sample with a scanning coil. An electron beam image can be obtained by capturing secondary electrons generated from the sample by electron beam irradiation, by use of a detector. Since secondary electrons are largely generated at edges of the pattern, portions corresponding to edges of the pattern in the electron beam image become bright. The magnification ratio of a scanned image can be changed with the ratio of the scanning width (constant) on the CRT to the scanning width (variable) of the electron beam on the sample. In the CD-SEM, a position where dimensions are to be measured with the scanned image is specified, and dimensions are measured through calculation based on the magnification ratio by use of a signal waveform obtained from the position.

Diverse methods of automatic dimensional measurement using a signal waveform have been proposed. As a typical method, a "threshold method" is shown in FIG. 3. With a pattern having a trapezoid-shaped cross section as shown in FIG. 3, the amount of signal for a portion corresponding to the side wall of the pattern forms a large signal waveform. Each portion having a large amount of signal on the left-hand side and on the right-hand side is referred to as a left white band (left WB) and a right white band (right WB), respectively. With the threshold method, maximum and minimum values are obtained in each of the right and left WBs. In addition, a threshold is calculated from these above values, and a position at which a signal waveform crosses the threshold is detected as an edge position. The distance between the right and left edges is recognized as dimensions (CD value).

A process of general automatic dimensional measurement is shown in FIG. 4. A wafer is placed on a stage (Step 101). The stage is moved to a position near the dimensional measurement section (Step 102), and images are acquired with a low magnification ratio of about 10000× (Step 103). The precise position of the dimensional measurement section is obtained through pattern recognition using registered images as templates (Step 104). Through limiting the scanning range of the primary electron beam to a narrower range centering on the obtained position (Step 105), images are acquired with a high magnification ratio of about 150000× (Step 106), and dimensions are measured (Step 108). The above-mentioned operation for changing the imaging position by changing the scanning position of the primary electron beam without moving the stage is referred to as an "image shift". High-power images are acquired through the image shift after acquiring low-power images instead of acquiring high-power images at first since it is difficult to include a pattern to be measured in high-power images generally due to insufficient stop accuracy of the stage. The increasing of fineness of semiconductor patterns has increased the demand for improved accuracy in measurement of the CD-SEM. There have been a demand for measurement reproducibility of a single apparatus, and a plurality of apparatuses are used in many cases due to the relationship between the throughput and semiconductor production volume. For this reason, it is important to reduce the difference in dimensions measured by apparatuses (instrumental error).

In relation to the SEM, correction of aberration of the primary electron beam is presented in Japanese Patent Laid-open No. 2004-127930 and a method for obtaining an electron beam landing angle through calculation is presented in, for example, "Development of Beam Tilt Angle Calibration Technology in a CD-SEM" on pages 48 to 53 in the collected papers of View2004 vision technology application workshop lecture.

SUMMARY OF THE INVENTION

Although the image shift is performed to capture high-power images with the above-mentioned background technology, the amount of image shift varies depending on the stop position of the stage. Generally, when the image shift is performed, the electron beam slightly tilts. With an optical system examined by the inventors, when the coordinate of the center of the viewing field is (0,0) as shown in FIG. 5, the beam tilt angle in the x direction, $\phi x$, and the beam tilt angle in the y direction, $\phi y$, at coordinate (x,y) are represented by Formula 2. As represented by Formula 1 shown in FIG. 5, the tilt angle increases in proportion to the distance r from the center of the viewing field to the coordinate (x,y). P is a proportional constant and Q a constant representing rotation. The symbols dx and dy are offset of the center of the viewing field in the optical system. Since the stop position of the stage fluctuates within a certain range, the amount of the image shift varies accordingly, resulting in the fluctuation of the beam landing angle with respect to the sample.

FIG. 6 is a schematic diagram showing the relationship between the electron beam landing angle and the CD value, where $\phi$ is the electron beam landing angle and $\theta$ is the tilt angle of a side wall of the sample (with the perpendicularity set to 0 degrees). FIG. 6A shows the case of $\phi=0$; FIG. 6B, the case of $\phi<\theta$; and FIG. 6C, the case of $\phi>\theta$. When the CD value in FIG. 6A is CDa, the CD value in FIG. 6B is CDb, and the CD value in FIG. 6C is CDc. In this case, CDa and CDb are equal and CDc is larger than CDa and CDb. This is because in FIG. 6B, the decrement of the left WB width equals the increment of the right WB width, and in FIG. 6C, the decrement of the left WB width is smaller than the increment of the right WB width.

When the same object is measured a plurality of number of times, if the amount of the image shift changes each time, the CD value also changes each time. This results in reduced measurement reproducibility. Further, although the beam tilt angle at coordinate (0,0) is assumed to be 0 degrees in FIG. 5, it is not necessarily 0 degrees but actually is different for each apparatus. It is assumed that the beam tilt angles at coordinate (0,0) of apparatus A and apparatus B are φa and φb, respectively and that the same object is measured by apparatus A and apparatus B. Then, the measurement results are compared. Since the measurement reproducibility is not 0, it is meaningless to consider the instrumental error based on the results of a single measurement. However, although the difference between averages obtained from a large number of measurements is recognized as the instrumental error, it is clear that the instrumental error arises if φa is not equal to φb.

The present invention provides an electron microscope apparatus with high measurement reproducibility by decreasing the variation in the CD value caused by the variation in the electron beam landing angle. The present invention also provides such a calibration method for decreasing the difference in the electron beam landing angle between apparatuses.

With the present invention, the calibration shown in the following (a) is performed and then the measurement shown in the following (b) is performed.

(a) Calibration: Using a calibration sample on which a plurality of polyhedral structural objects with known angles, which are produced by the crystal anisotropic etching technology, are arranged in the viewing field, the beam landing angle at each position within the viewing field is calculated based on geometric deformation on images of each polyhedral structure, and beam control parameters for equalizing the beam landing angle at each position within the viewing field are registered in advance.

(b) Measurement: Images for measurement are captured with the same beam landing angle by applying the above-mentioned registered beam control parameters according to the position of the pattern to be measured within the viewing field.

Further, in the present invention, the above-mentioned calibration (a) and measurement (b) are performed by each apparatus.

Since the beam landing angle is equalized regardless of the amount of image shift by performing measurement (b) after performing above-mentioned calibration (a), it becomes possible to eliminate the variation in the CD value caused by the variation in the beam landing angle. Further, since the beam landing angle of each apparatus is substantially equalized by performing the above-mentioned calibration (a) and the measurement (b) with each apparatus, it becomes possible to eliminate the instrumental error caused by the difference in the electron beam landing angle between apparatuses.

These and other objects, features and advantages of the invention will be apparent from the following more particular description of preferred embodiments of the invention, as illustrated in the accompanying drawings.

DESCRIPTION OF THE PREFERRED EMBODIMENTS

Although the present invention can be applied to various types of charged particle beam apparatuses (SEM, FIB, etc.), a SEM is explained as a representative example in the following embodiments.

FIG. 1A shows a flow chart of calibration for making the beam landing angle perpendicular regardless of the amount of image shift, and FIG. 1B shows a flow chart of measurement, according to the present invention.

The following explains calibration method 200 with reference to FIG. 1A.

Figure 7:
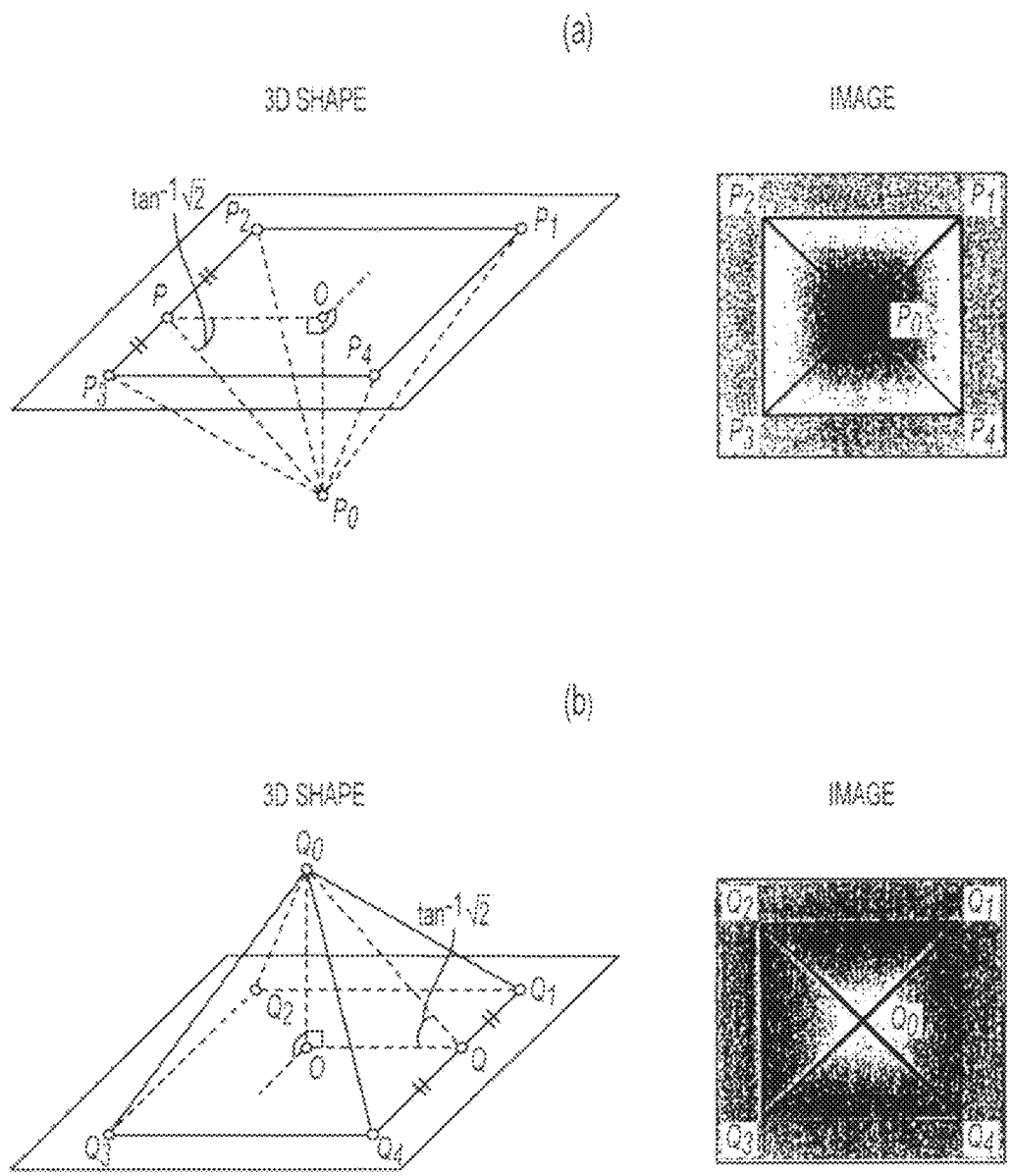
FIG. 7A is a diagram showing a concave pyramid as an example polyhedral structure on a calibration sample.
FIG. 7B is a diagram showing a convex pyramid as an example polyhedral structure on a calibration sample.

Firstly, a calibration wafer is placed on the stage in the SEM (Step 201). As a calibration wafer, a sample on which a number of polyhedral structural objects produced by the crystal anisotropic etching technology are arranged thereon is used. As a polyhedron, a concave or convex pyramid (quadrangular pyramid) is preferable for example. In the following explanation, each structural object is referred to as a pyramid. FIG. 7A shows a concave pyramid and FIG. 7B a convex pyramid. The crystal anisotropic etching technology is a technology for manufacturing a triangular pyramid and step structure with reference to the crystal surfaces by use of the fact that an etching speed for each crystal surface is varied when a specific etching solution (etchant) is applied to a single crystal. The angles formed by the lateral sides corresponding to crystal surfaces (four sides in the case of FIG. 7) are predetermined. This technology is characterized in that the shape accuracy is high in comparison with patterning with a normal semiconductor process.

Figure 8:
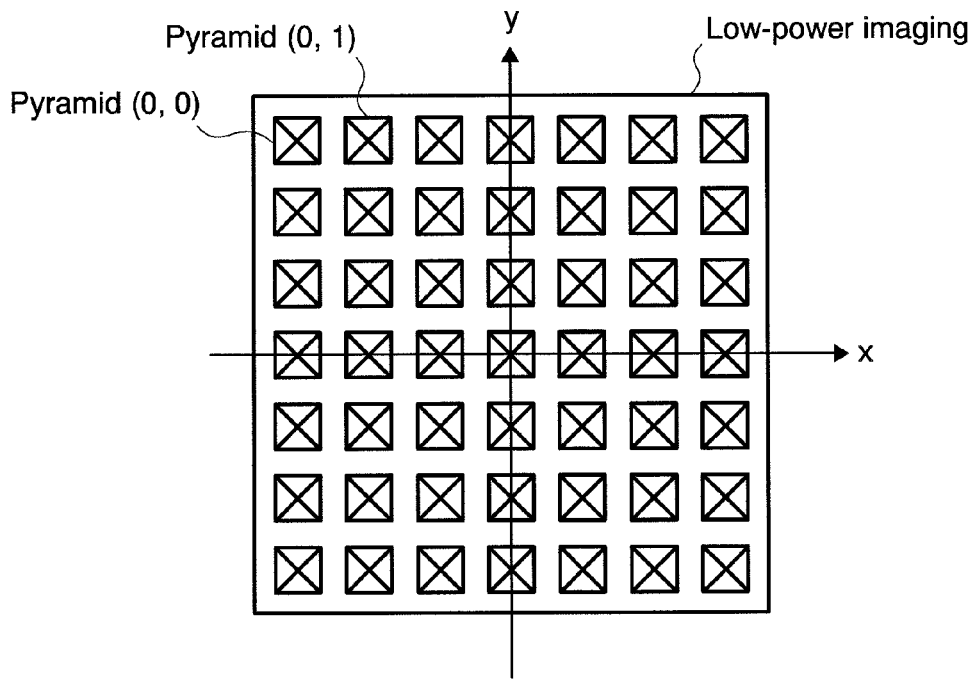
FIG. 8A is a diagram showing a low-power SEM image including a plurality of pyramids.
FIG. 8B is a table showing the position of each pyramid on the SEM image, which is converted to the number of pixels and nm length scale.

Then, the stage with a calibration wafer placed thereon is moved (Step 202) and images are captured with such a low magnification ratio that a plurality of pyramids are included on the screen (Step 203) as shown in FIG. 8A. Then, positions of each pyramid on the captured images are obtained through pattern recognition and then stored (Step 204). Specifically, after obtaining the positions of each pyramid on the images as shown in FIG. 8B, the positions are converted to positions in nm according to the magnification ratio of imaging and then stored.

Figure 9:
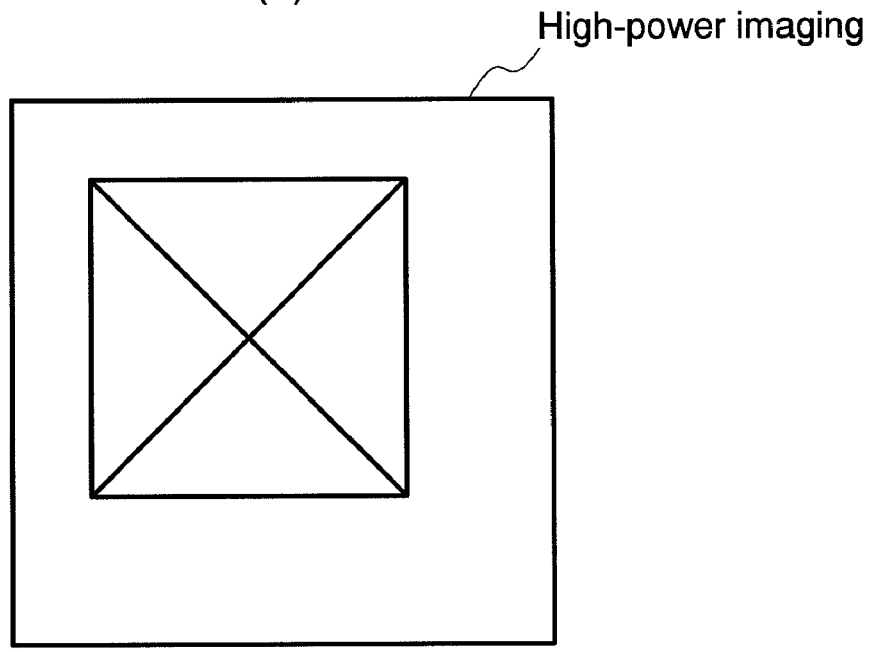
FIG. 9A is a diagram showing a high-power SEM image of the pyramid when the electron beam landing angle is perpendicular to the pyramid.
FIG. 9B is a diagram showing a high-power SEM image of the pyramid when the electron beam landing angle is tilted with respect to the pyramid.
Figure 9:
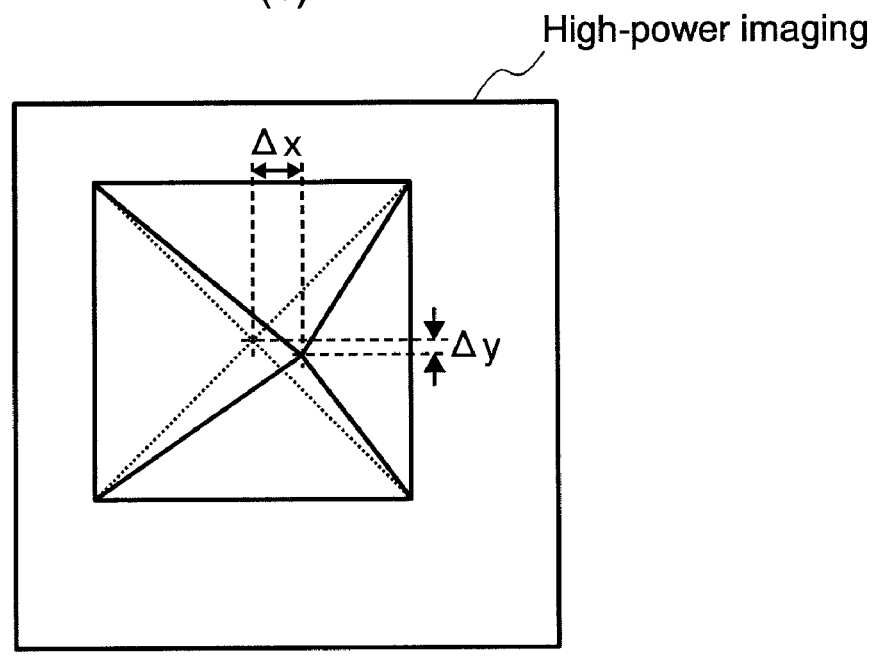

Then, according to the position of the pyramid stored previously, the deflection range of the electron beam is limited to a place around the pyramid to be measured (image shift in Step 205) and then high-power images are acquired (Step 206). If the electron beam landing angle is perpendicular to the pyramid, the image of the pyramid is as shown in FIG. 9A; if the electron beam landing angle is tilted with respect to the pyramid, it is as shown in FIG. 9B. Ridge lines and edge lines at the bottom of the pyramid are detected by image processing to obtain a shift $\Delta x$ in the x direction and a shift $\Delta y$ in the y direction of the intersection of the ridge lines of the pyramid. The shift $\Delta x$ reflects the variation $\phi x$ in the beam landing angle in the x direction, and the shift $\Delta y$ reflects the variation $\phi y$ in the beam landing angle in the y direction. As mentioned above, since the angles formed by the lateral sides of the pyramid are known, it is possible to calculate $\phi x$ and $\phi y$ from $\Delta x$ and $\Delta y$, respectively (Step 207).

A wafer produced by the crystal anisotropic etching technology is used as a calibration wafer since measurement of a three dimensional figure with another means (AFM, etc.) is not necessary because of predetermined angles formed by the lateral sides. This eliminates cumbersome tasks and other error factors. A pyramidal shape is used because of the advantage that both the electron beam landing angle $\phi x$ in the x direction and the electron beam landing angle $\phi y$ in the y direction can be calculated by observing a single pyramid.

With respect to a detail calculation of the electron beam landing angle, it is possible to apply a method reported in, for example, "Development of Beam Tilt Angle Calibration Technology in a CD-SEM" on pages 48 to 53 in the collected papers of View2004 vision technology application workshop lecture (Nonpatent Reference 1).

The above-mentioned calculation of the beam landing angle is repeated for all the pyramids included on the low-power images acquired in Step 203 (Step 208). This obtains a relationship between each position (x,y) in the viewing field and the beam landing angle.

Based on the relationship between the position (x,y) and the beam landing angle for several pyramids, obtained as mentioned above, the parameters P, Q, dx, and dy in FIG. 5 are obtained through the least square method or the like (Step 209).

Then, by use of the relationship between the position (x,y) and the beam landing angle, which are obtained in Step 209, the following two types of conditions are registered: beam incidence conditions for the objective lens allowing the beam landing angle to be maintained perpendicular to control the position; and setting conditions for a focusing lens for correcting the aberration caused by the variation in the incidence conditions for the objective lens (Step 210). Technologies presented in Japanese Patent Laid-open No. 2004-127930 (Reference 1) can be applied to above-mentioned aberration correction.

Figure 10:
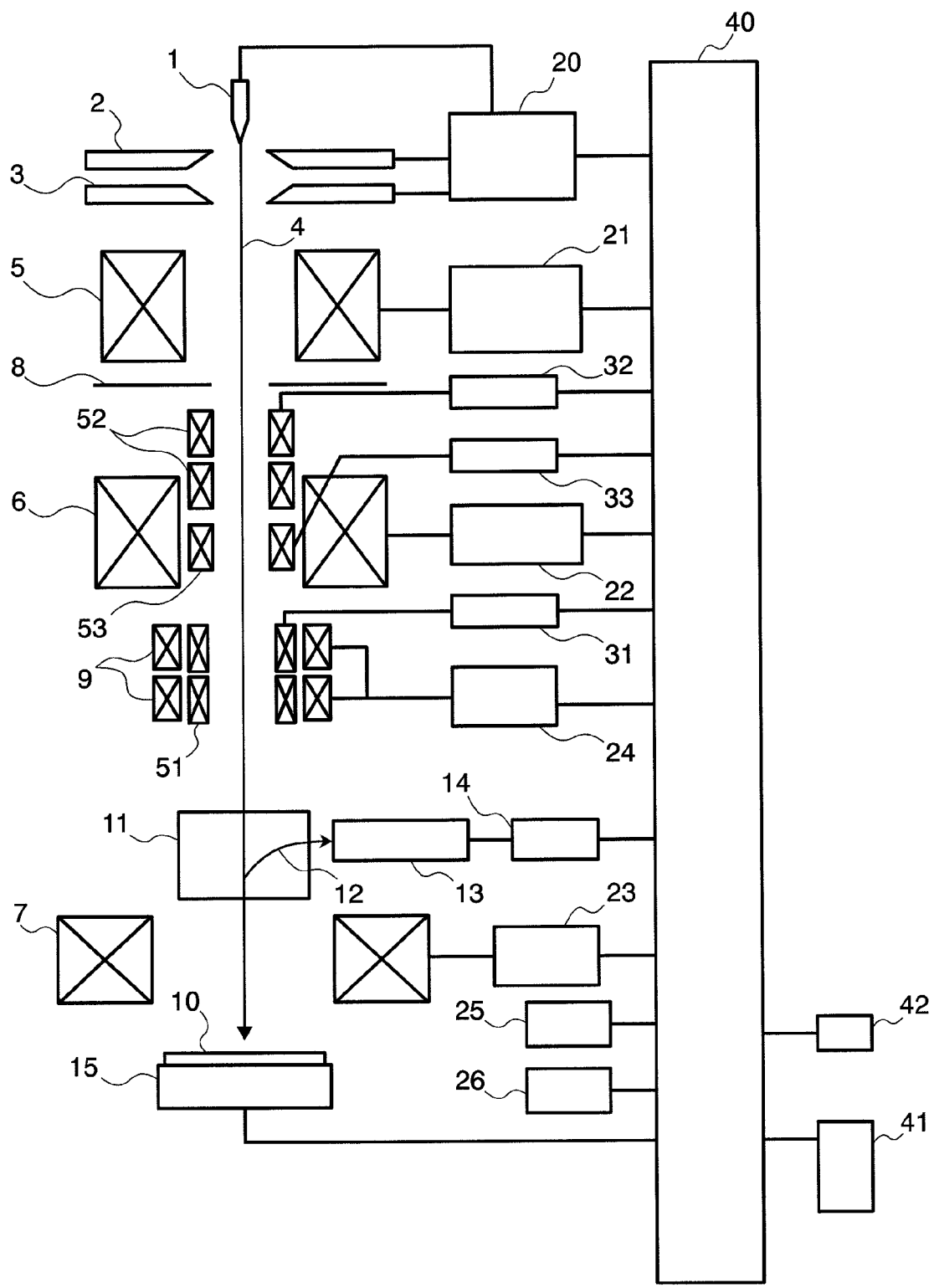
FIG. 10 is a schematic block diagram of an electron microscope.

The outline configuration of an electron microscope disclosed in Japanese Patent Laid-open No. 2004-127930 is shown in FIG. 10. In FIG. 10, a voltage is applied between a cathode 1 and a first anode 2 by a high-voltage control power supply 20 that is controlled by a computer 40, and a primary electron beam 4 is drawn from the cathode 1 by means of a predetermined emission current. An acceleration voltage is applied between the cathode 1 and a second anode 3 by the high-voltage control power supply 20 that is controlled by the computer 40, and the primary electron beam 4 emitted from the cathode 1 is accelerated and advances to a lens system in the following stage. The primary electron beam 4 is converged by a focusing lens 5 controlled by a lens control power supply 21. After an unnecessary region of the primary electron beam is eliminated by a throttle plate 8, the resultant primary electron beam is converged onto a sample 10 as a microspot by a focusing lens 6 controlled by a lens control power supply 22 and an objective lens 7 controlled by an objective lens control power supply 23. The primary electron beam 4 two-dimensionally scans the sample 10 by use of a scanning coil 9 that is controlled by a control power supply 24.

A secondary signal 12, such as secondary electrons generated from the sample 10 by irradiation of the primary electron beam, advances to the upper part of the objective lens 7. Then, the secondary signal 12 is separated from primary electrons by a orthogonal electromagnetic field generating apparatus 11 for secondary signal separation and detected by a secondary signal detector 13. The signal detected by the secondary signal detector 13 is amplified by a signal amplifier 14. Then, the signal is transferred to an image memory 25 and then displayed on an image display 26 as a sample image. A two-stage deflecting coil 51 is arranged at the same position as the scanning coil 9, making it possible to two-dimensionally control the position of the primary electron beam 4 entering the objective lens by means of a tilt control power supply 31 so that an object point of the objective lens acts as a deflection supporting point. In this manner, the beam can be tilted with respect to the optical axis of the objective lens.

An astigmatic correction coil 53 is arranged near the focusing lens 6, which is controlled by an astigmatic correction power supply 33 in conjunction with beam tilt conditions. A two-stage deflecting coil 52 is arranged between the focusing lens 6 and the throttle plate 8, making it possible to two-dimensionally control the position of the primary electron beam 4 entering the focusing lens 6 by means of an aberration control power supply 32 so that an object point of the focusing lens 6 acts as a deflection supporting point. In addition to the primary electron beam position control signal with an object point of the objective lens acting as a deflection supporting point, a control signal, which can two-dimensionally control the irradiation position of the primary electron beam on the sample, can be applied to the deflecting coil 51, making it possible to correct the shift of the irradiation position in conjunction with beam tilt conditions. A sample stage 15 can move the sample 10 at least in two directions (the X direction and the Y direction) within a plane perpendicular to the primary electron beam. From an input apparatus 42, it is possible to specify image capturing conditions (scanning speed, acceleration voltage, etc.) and beam tilting conditions (tilting direction and tilt angle) and output images and store images to a storage apparatus 41. When the primary beam 4 is deflected by the deflecting coil 52 (hereinafter referred to as aberration control coil) so that an object point of the focusing lens 6 acts as a deflection supporting point, it is possible to generate aberration having the same characteristics as in beam tilting from the focusing lens 6.

There are such conditions for the focusing lens 6 that the aberration formed by the objective lens 7 be canceled. The beam tilt angle by the objective lens 7 is proportional to the current of the deflecting coil 51 (hereinafter referred to as beam tilt angle control coil) and the beam tilt angle by the focusing lens 6 is proportional to the current of the aberration control coil 52. Therefore, what is necessary is to control the beam tilt angle control power supply 31 and the aberration control power supply 32 by means of the computer 40 so that the above-mentioned aberration canceling conditions be satisfied.

In the above description, steps 202 to 209 in FIG. 1A were performed once. However, in order to improve the accuracy, the process may be designed to return to Step 202 after performing the above-mentioned steps once, move the imaging section to another position on the wafer, repeat the same processing N times, and obtain a coefficient of the formula representing the relationship between the amount of image shift and the electron beam landing angle by averaging the coefficient calculated in each time.

Subsequently, the following explains a measurement method 300 with reference to FIG. 1B.

Figure 3:
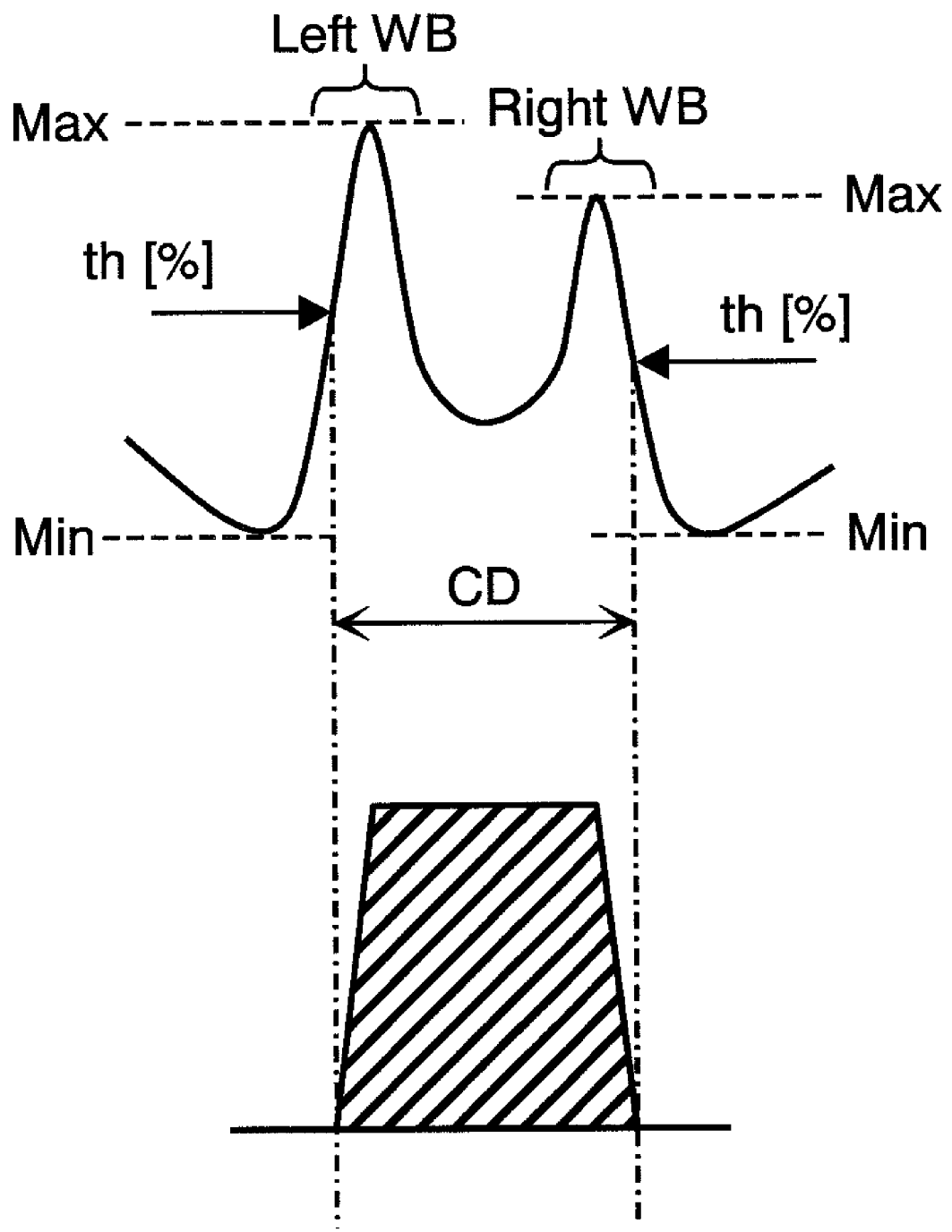
FIG. 3 is a diagram explaining the threshold method which is an automatic dimensional measurement method using a signal waveform.
Figure 4:
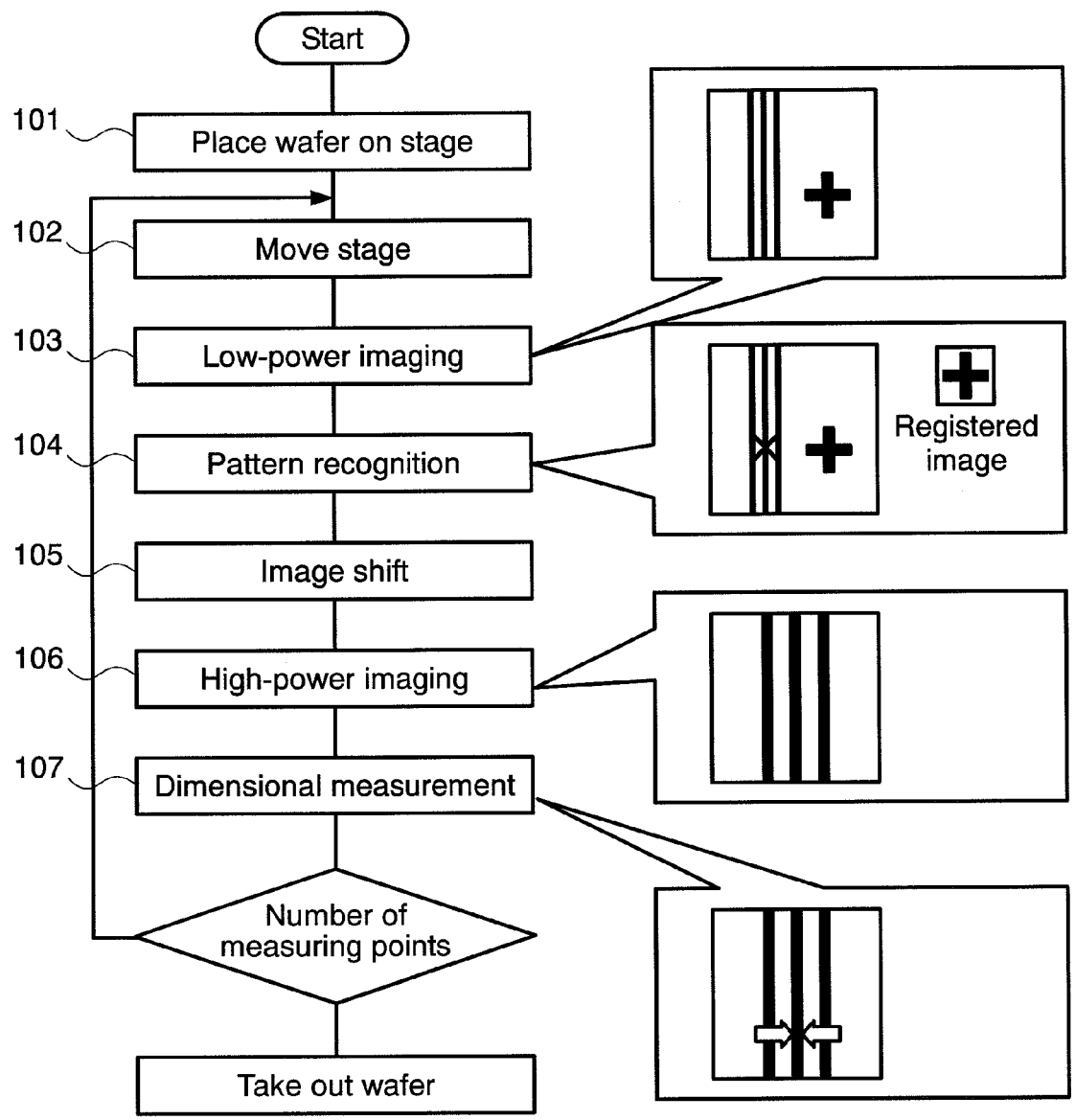
FIG. 4 is a diagram showing a process of general automatic dimensional measurement.

FIG. 3, which is explained in the background technology, also applies to a step of low-power imaging of a wide region containing the pattern to be measured (Step 301) and a step of obtaining a position of the pattern to be measured through pattern recognition (Step 302). Subsequent Step 303 reads out, according to the position (x,y) of the pattern to be measured, the beam incidence conditions for the objective lens and the incidence conditions for the objective lens, which are registered in Step 210, such that the beam landing angle be maintained perpendicular to control the position of the pattern to be measured. Then, Step 304 sets these conditions. Further, the deflection range of the electron beam is limited to the pattern to be measured or a region around the pattern (image shift in Step 305). High-power images are taken (Step 306) and dimensional measurement is performed (Step 307).

The above is a basic embodiment of the present invention. In accordance with the present embodiment, since the beam landing angle becomes perpendicular regardless of the amount of image shift, it becomes possible to eliminate the variation in the CD value caused by the variation in the beam landing angle.

Figure 13:
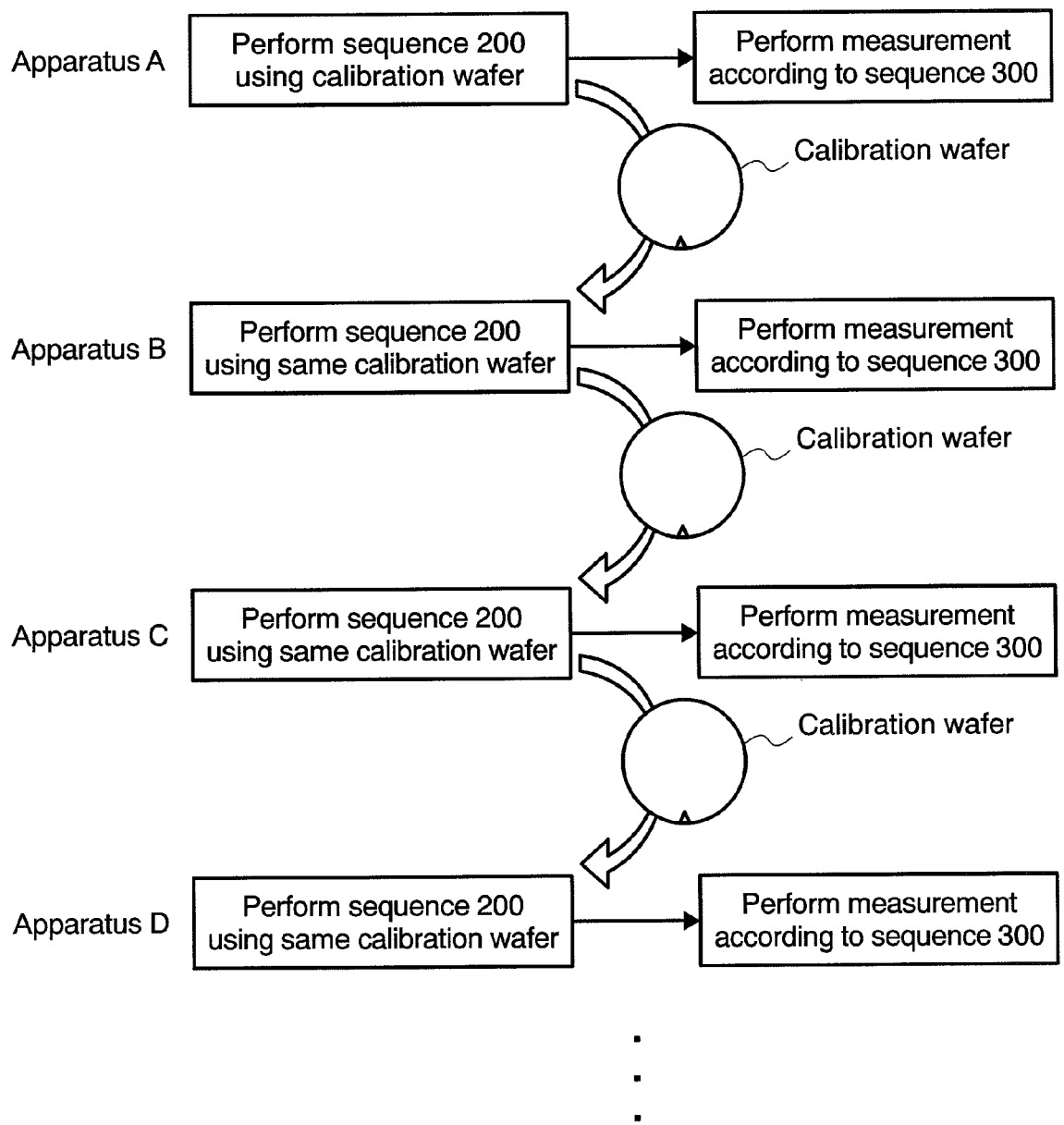
FIG. 13 is a diagram showing a flow of a calibration wafer between apparatuses when decreasing the difference in the electron beam landing angle between apparatuses.
Figure 14:
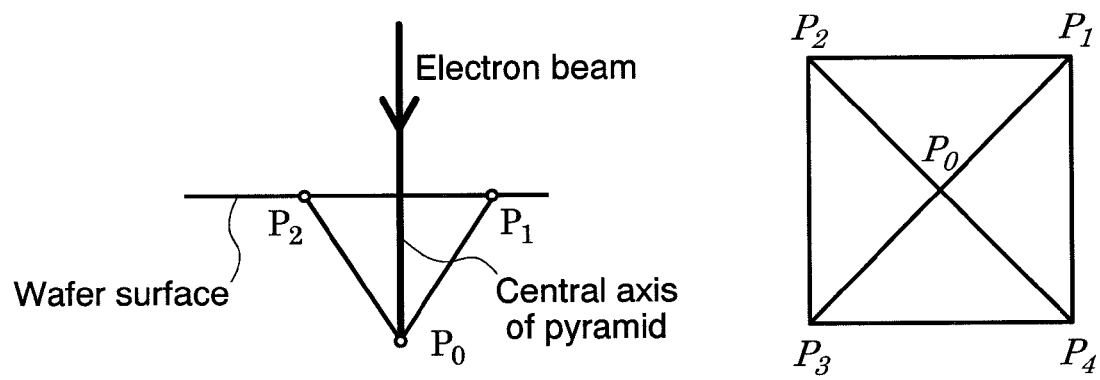
FIG. 14A is a diagram showing a pyramidal shape formed on the calibration wafer with the central axis of the pyramid formed perpendicularly to the wafer surface.
FIG. 14B is a diagram showing a pyramidal shape with the central axis of the pyramid tilted with respect to the wafer surface.
Figure 14:
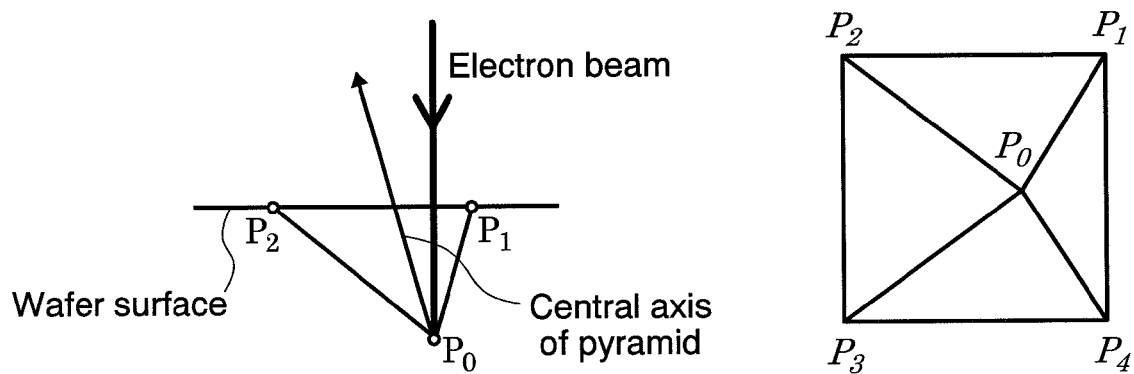

Then, the following explains a configuration for decreasing the difference in the electron beam landing angle between apparatuses, with reference to FIG. 13. As shown in FIG. 13, if the calibration in FIG. 1A is performed for each apparatus by use of the same calibration wafer, the beam landing angle of each apparatus is substantially equalized, making it possible to eliminate the instrumental error caused by the difference in the electron beam landing angle between apparatuses. The same calibration wafer is used because the angles formed by the four lateral sides are guaranteed but the angles formed by the lateral sides and bottom are not guaranteed with respect to a pyramidal shape produced by the crystal anisotropic etching technology. As shown in FIG. 14A, although it is ideal that the central axis of the pyramid is perpendicular to the wafer surface, a situation in FIG. 14B is possible depending on the wafer slice angle from the single crystal ingot. Since it is difficult to distinguish the variation in the beam landing angle from the situation in FIG. 13B based on the taken images, it is preferable that the same calibration wafer be used so as to eliminate the difference in the electron beam landing angle between apparatuses.

[Modification 1]

Figure 5:
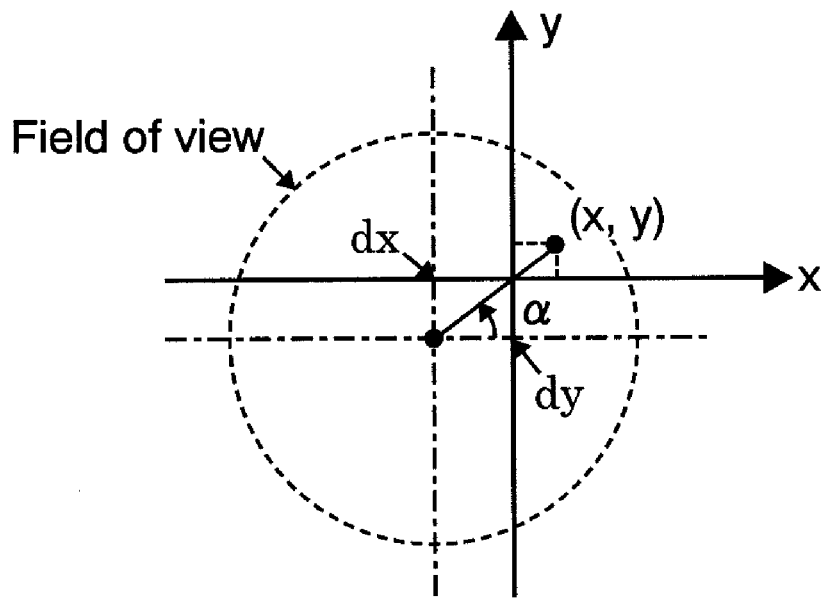
FIG. 5 is a diagram showing the relationship between the position on the viewing field and the beam tilt angle.
Figure 6:
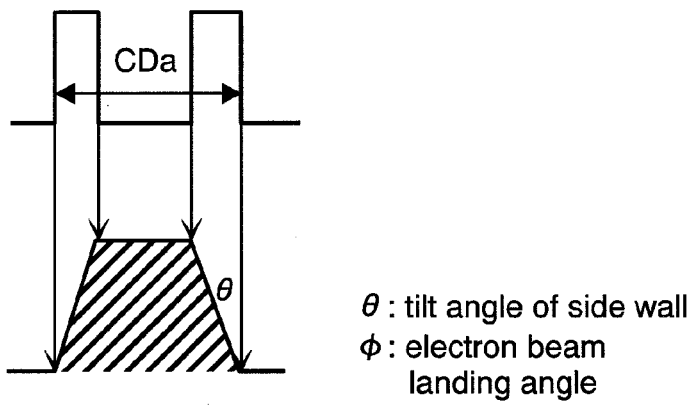
FIG. 6A is a schematic diagram showing the relationship between the electron beam landing angle φ and the CD value when φ=0.
FIG. 6B shows the case where φ is smaller than the tilt angle θ of the side wall of the pattern.
FIG. 6C shows the case where φ is larger than θ.
Figure 6:
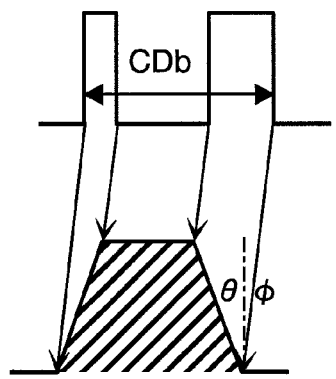
Figure 6:
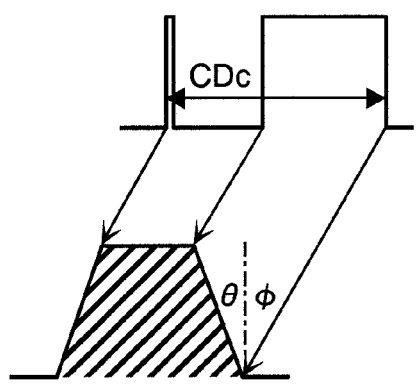

FIGS. 11A and 11B show a calibration flow chart 200' and a measurement flow chart 300' concerning a first Modification, respectively. In the flow charts in FIGS. 11A and 11B, the steps with the same numbers as those in FIG. 1 perform the same processing. In the above-mentioned embodiment, parameters P, Q, dx, and dy in FIG. 5 are obtained in Step 209 in the calibration flow 200. This Modification 1, however, creates a table describing the beam landing angle calculated at the position (x,y) of each pyramid on the viewing field (Step 209'). Then, the present embodiment creates a table describing required beam control parameters (beam incidence conditions for the objective lens, and setup conditions for the focusing lens for correcting the aberration) at each position and then registers these conditions (Step 210').

In order to reduce measurement error of the beam landing angle at each position, the obtain beam landing angle $\phi x\ (i,j)$ and $\phi y\ (i,j)$ at a noticed pyramid $(i,j)$ may be obtained by an average (Formula 2) of beam landing angles at adjacent pyramids and a median (Formula 3) of the beam landing angles at adjacent pyramids.

$$\phi_x(i,j) = \{\phi_x(i,j) + \phi_x(i,j-1) + \phi_x(i-1,j) + \phi_x(i,j+1) + \phi_x(i+1,j)\}/5$$

$$\phi_y(i,j) = \{\phi_y(i,j) + \phi_y(i,j-1) + \phi_y(i-1,j) + \phi_y(i,j+1) + \phi_y(i+1,j)\}/5 \quad \text{(Formula 2)}$$

$$\phi_x(i,j) = \text{median}\{\phi_x(i,j), \phi_x(i,j-1), \phi_x(i-1,j), \phi_x(i,j+1), \phi_x(i+1,j)\}$$

$$\phi_y(i,j) = \text{median}\{\phi_y(i,j), \phi_y(i,j-1), \phi_y(i-1,j), \phi_y(i,j+1), \phi_y(i+1,j)\} \quad \text{(Formula 3)}$$

Step 303' in the measurement flow chart 300' reads out a table describing beam incidence conditions for the objective lens and setup conditions for the focusing lens for correcting the aberration, which are registered in Step 210'. Since above-mentioned conditions on the table have data only on positions of pyramids used for calibration, electron beam control parameters according to the position (x,y) of the pattern to be measured are obtained through interpolation. The subsequent steps (Steps 304 to 307) are common to Embodiment 1.

In the present embodiment, since the beam landing angle is perpendicular regardless of the amount of image shift like Embodiment 1, it is possible to eliminate the variation in the CD value produced by the variation in the beam landing angle. Embodiment 1 applies to the case where the relationship between the position (x,y) on the viewing field and the beam landing angle can be described with a formula. However, the present embodiment has no such restrictions and therefore is more general purpose.

[Modification 2]

Figure 12:
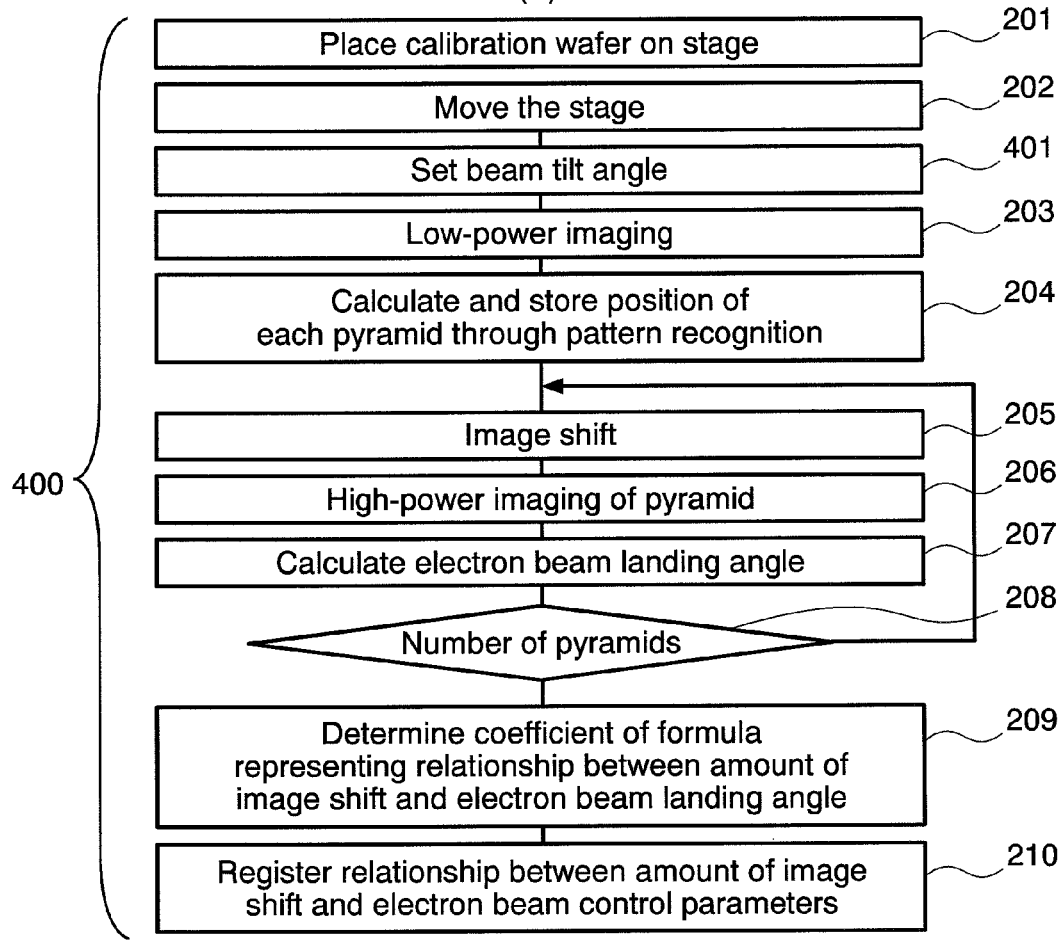
FIG. 12A is a flow chart of calibration concerning Modification 2 of the present invention.
FIG. 12B is a flow chart of measurement concerning Modification 2 of the present invention.
Figure 12:
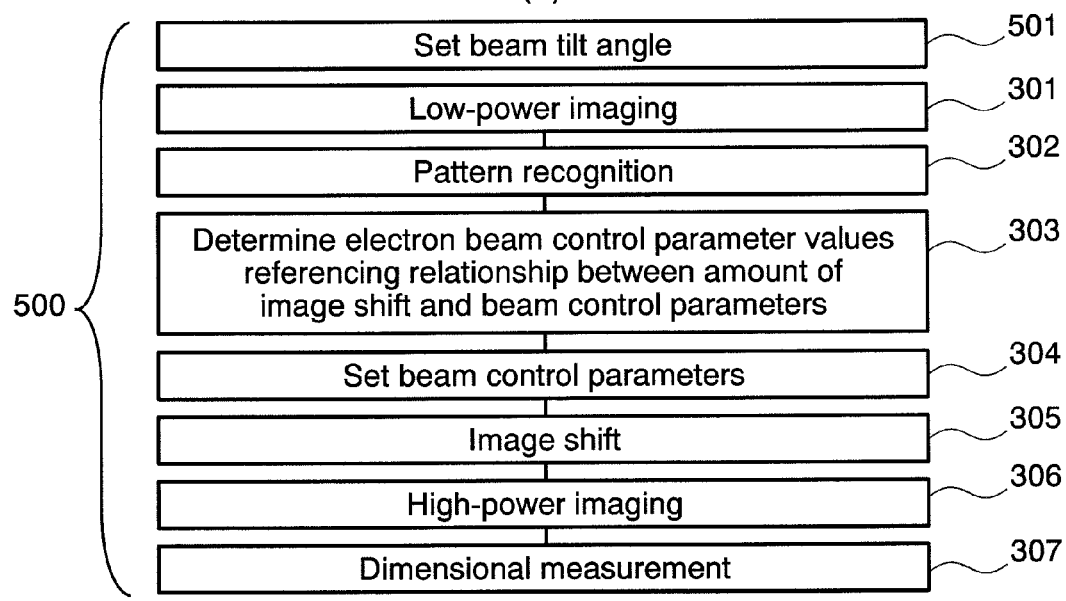

FIGS. 12A and 12B show a calibration flow chart 400 and a measurement flow chart 500 concerning Modification 2, respectively. Although the above-mentioned embodiment and Modification 1 intend to make the beam landing angle perpendicular regardless of the amount of image shift, the present embodiment intends to capture inclined images by a predetermined beam landing angle regardless of the amount of image shift. In flow charts in FIGS. 12A and 12B, the steps with the same numbers as those in FIG. 1 perform the same processing.

In the calibration flow chart 400, Step 401 for setting the beam tilt angle is added prior to Step 203 for capturing low-power images. Also, in the measurement flow chart 500, Step 501 for setting the beam tilt angle is added prior to Step 301 for capturing low-power images. In accordance with the present embodiment, since the beam landing angle becomes a desired tilt angle regardless of the amount of image shift, it is possible to eliminate the variation in the CD value produced by the variation in the beam landing angle or the variation in other characteristic quantities obtained from the inclined images.

[Modification 3]

The following describes a variation in the polyhedral structure on a sample for beam landing angle calibration.

Figure 15:
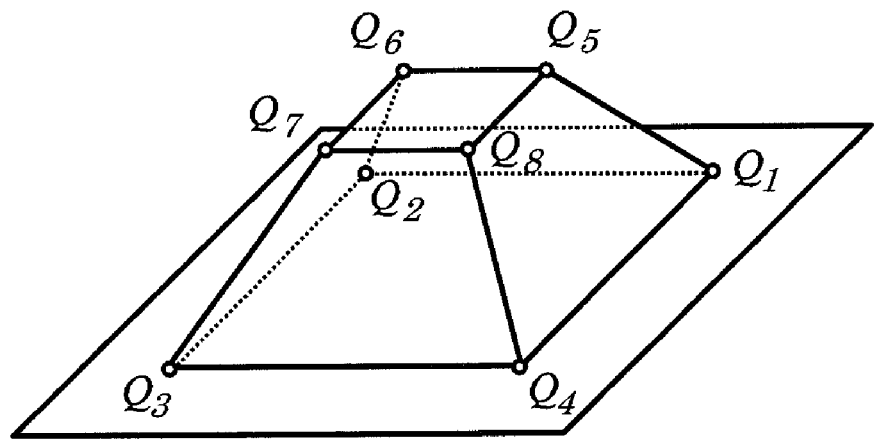
FIG. 15A is a perspective diagram of a pyramidal structure with a flat top (quadrangular pyramid with a trapezoidal shape) formed on a calibration wafer.
FIG. 15B is a two-dimensional diagram of a pyramidal structure with a flat top (quadrangular pyramid with a trapezoidal shape) with a virtual apex Q'0 obtained.
Figure 15:
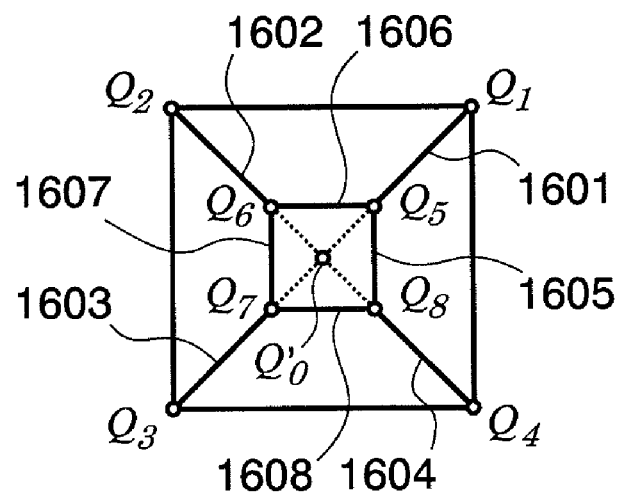

In the above-mentioned embodiment, a pyramidal shape produced by the crystal anisotropic etching technology is used as a polyhedral structure on the sample for calibration. A shape which makes it possible to calculate both the electron beam landing angle in the x direction, $\phi x$, and the electron beam landing angle in the y direction, $\phi y$, by observing a single structure is not limited to a pyramidal shape. For example, as shown in FIG. 15 (a), a pyramid with a flat top may be used, which is produced by stopping anisotropic etching halfway. It is possible to obtain a variation in the beam landing angle like a pyramidal shape, for example, by extending line segments 1601 to 1604 in FIG. 15B and obtaining, from the intersection, a virtual apex $Q'_0$ corresponding to the apex $Q_0$ in FIG. 7 (b).

Although FIG. 15A shows an example pyramidal shape with a flat top, a pyramidal shape with a round top can also be processed likewise.

[Modification 4]

The following describes the size and arrangement of pyramids on a sample for calibration.

Figure 1:
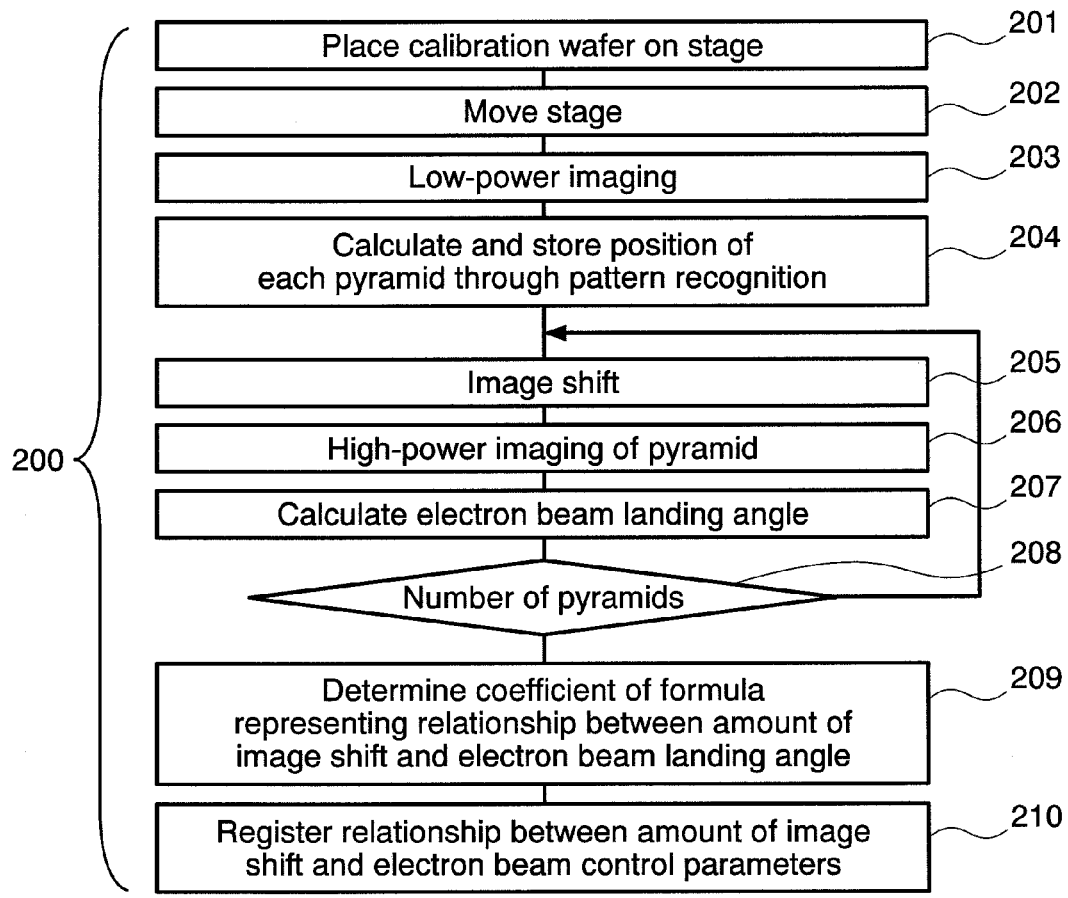
FIG. 1A is a flow chart of calibration according to Embodiment 1 of the present invention.
FIG. 1B is a flow chart of measurement according to Embodiment 1 of the present invention.
Figure 1:
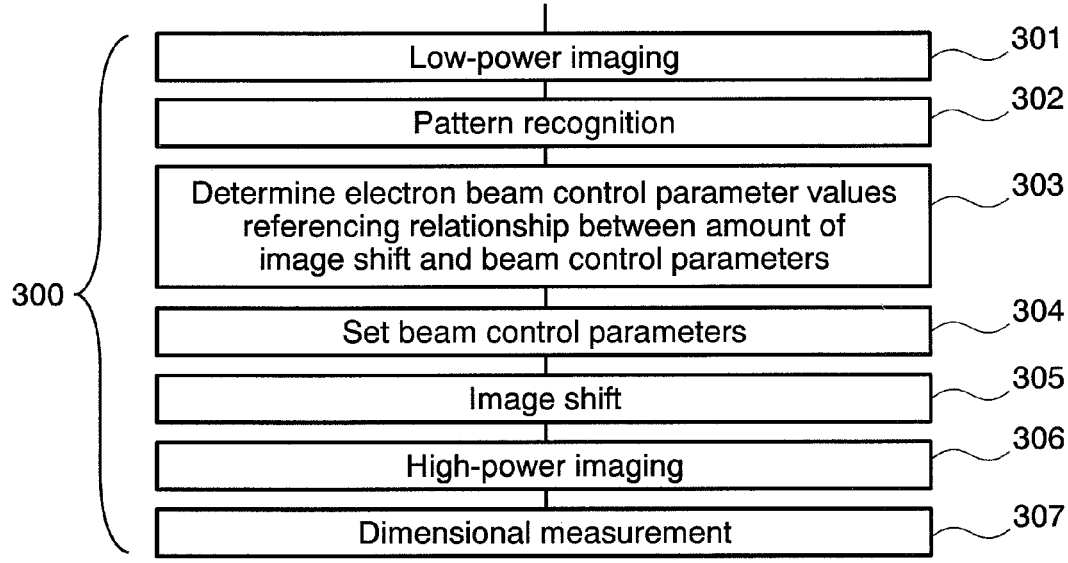
Figure 2:
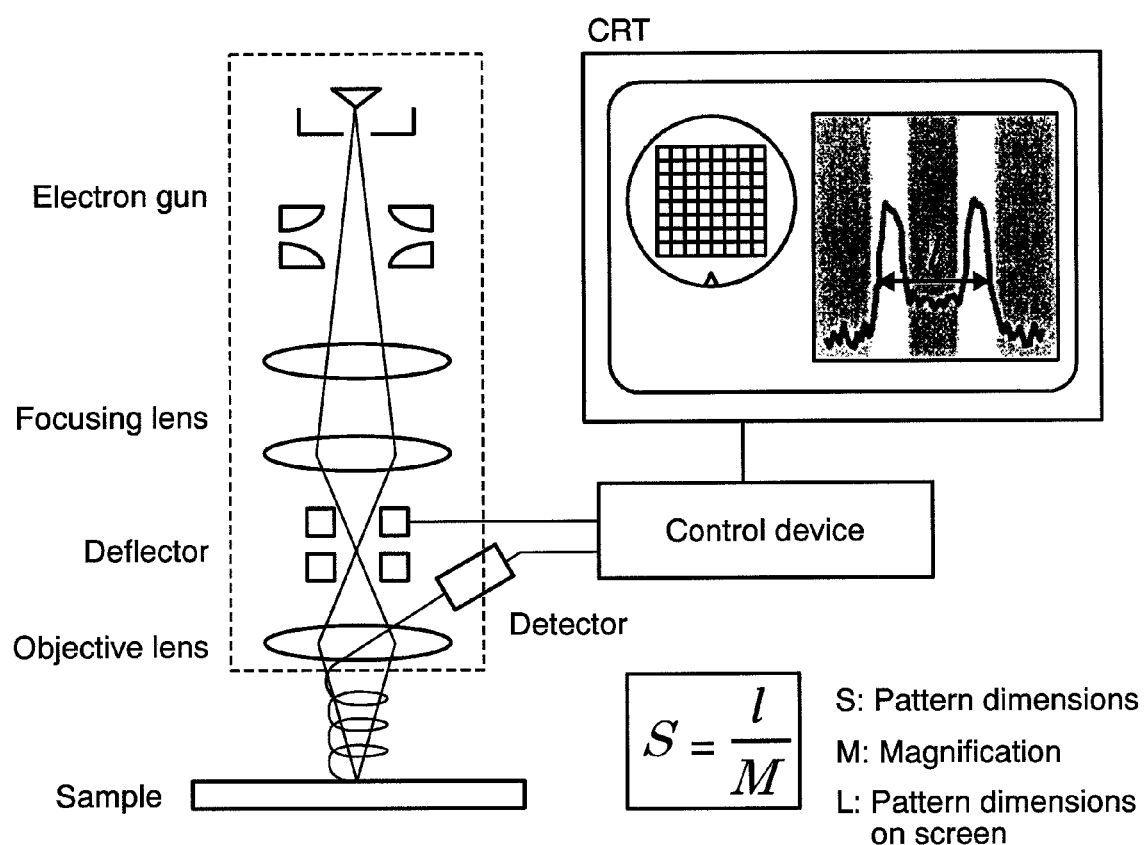
FIG. 2 is a diagram showing the principle of a conventional CD-SEM.
Figure 11:
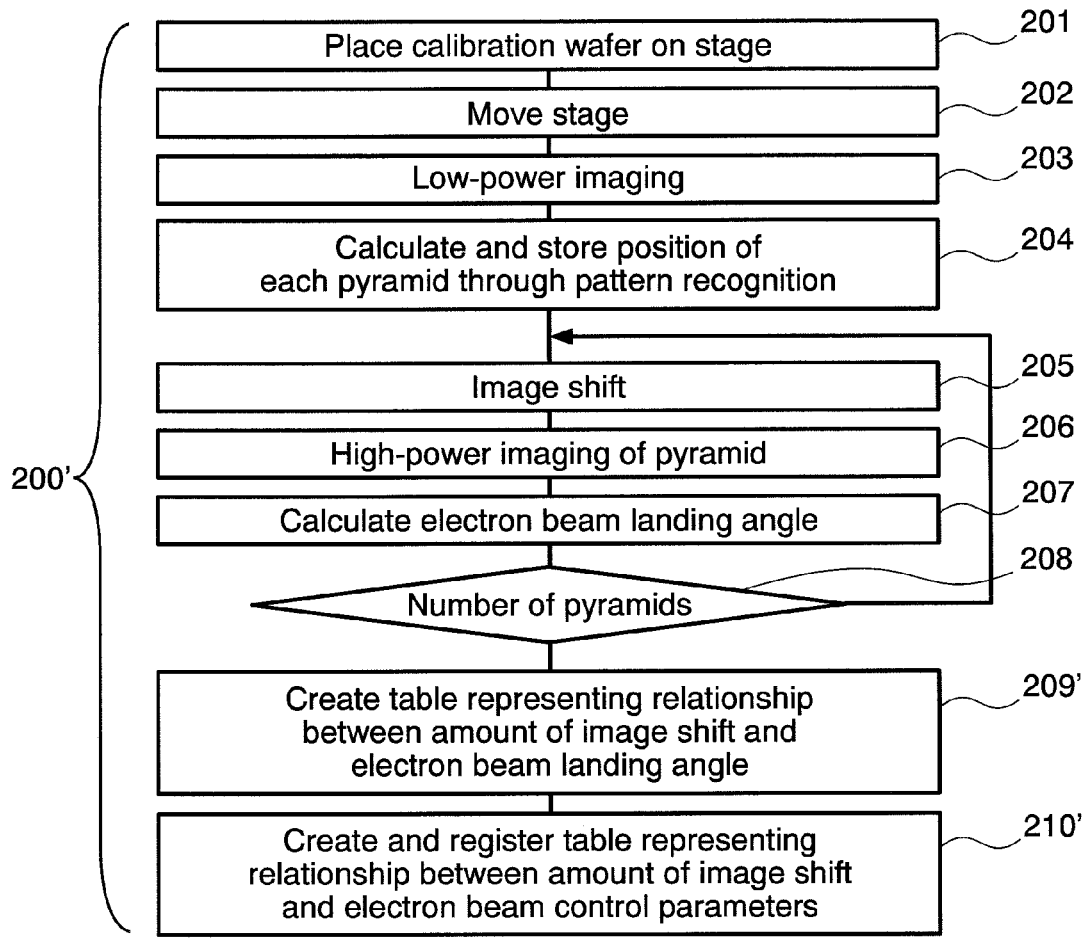
FIG. 11A is a flow chart of calibration concerning Modification 1 of the present invention.
FIG. 11B is a flow chart of measurement concerning Modification 1 of the present invention.
Figure 11:
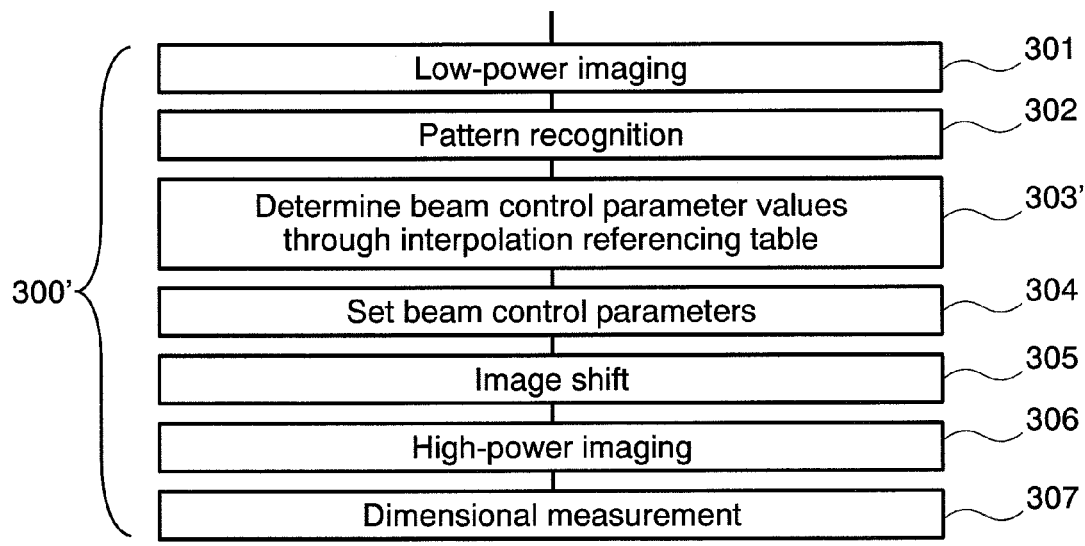

It is necessary that the size of a pyramid fits into an image at the time of high-power imaging in Step 206 in FIG. 1 and FIG. 11. In order to obtain a beam landing angle with higher accuracy, on the other hand, larger geometric deformation occurring when the beam landing angle changes, i.e., larger $\Delta x$ and $\Delta y$ shown in FIG. 9B, is more advantageous. With a pyramid produced by anisotropic etching, since $\Delta x$ and $\Delta y$ are proportional to the size thereof, a larger pyramid is more advantageous in order to gain accuracy.

With respect to the arrangement of pyramids, in order to increase the number of beam landing angle measuring points within the viewing field, it is preferable that as many pyramids as possible be included at the time of low-power imaging in Step 203 in FIG. 1 and FIG. 11. For this purpose, a narrower interval of pyramids is preferable. However, when pyramids of the same size are arranged at equal intervals, it becomes difficult to identify each pyramid. Pyramids produced by anisotropic etching are highly uniform. However, particularly in the third embodiment shown in FIG. 12, using not only the same calibration wafer for each apparatus but also the same pyramid group on the same wafer is more advantageous so as to eliminate the difference in the electron beam landing angle between apparatuses.

Figure 16:
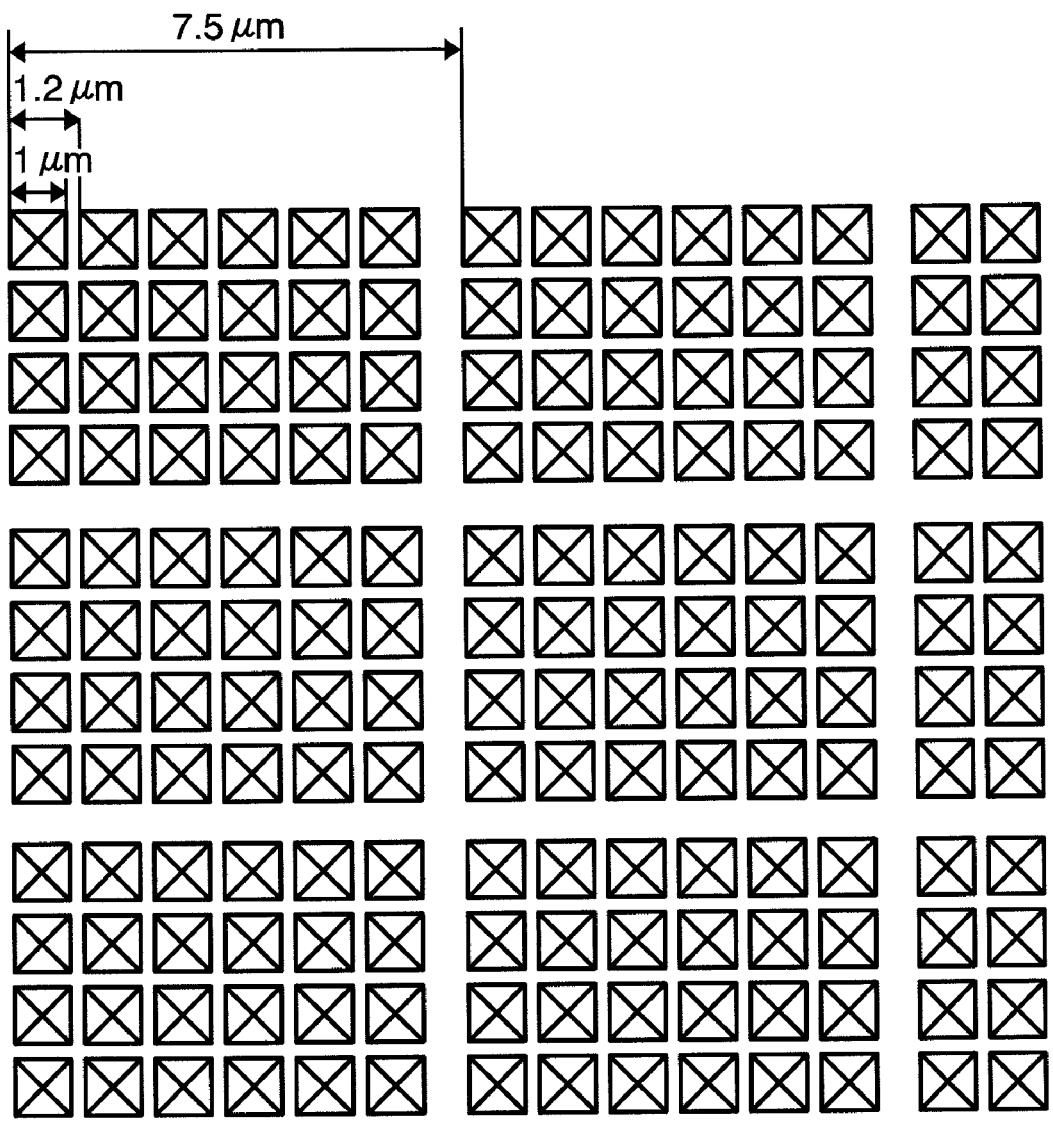
FIG. 16 is a diagram showing an example of preferable arrangement of pyramids on a calibration sample.

When the imaging range at the time of low-power imaging is about 10 μm and that at the time of high-power imaging is about 1 μm, it is preferable that the size of a pyramid be about 1 μm and the pitch be 1 μm and a little (1.2 μm in FIG. 16) and that a certain portion be arranged with a different pitch from that of the peripheral portions to facilitate identification of each pyramid.

Alternatively, pyramids with a different size or shape from that of surrounding portions may be arranged instead of arranging a portion with a different pitch from that of surrounding portions.

[Modification 5]

The following describes the form of a sample for calibration and how it is used.

Figure 17:
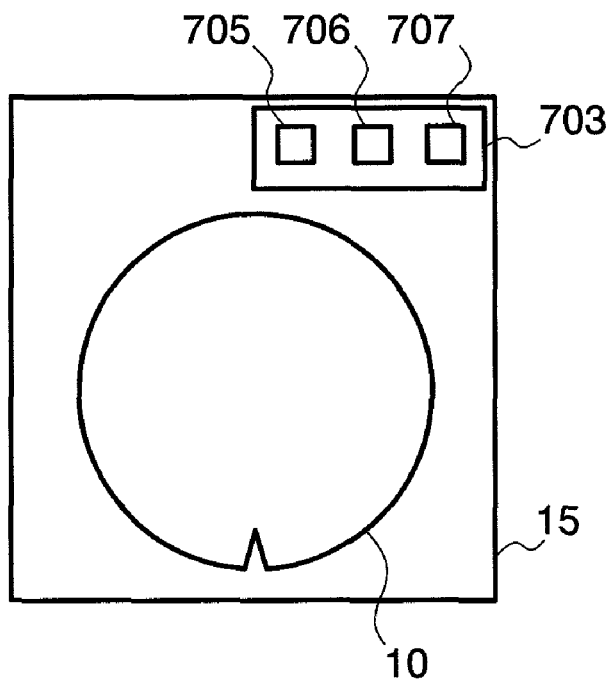
FIG. 17A is a two-dimensional diagram of a sample stage, showing a condition where a fragment for beam landing angle correction is attached to the holder on the sample stage as a calibration sample.
FIG. 17B is a flow chart showing a process of adjustment of an optical system.
Figure 17:
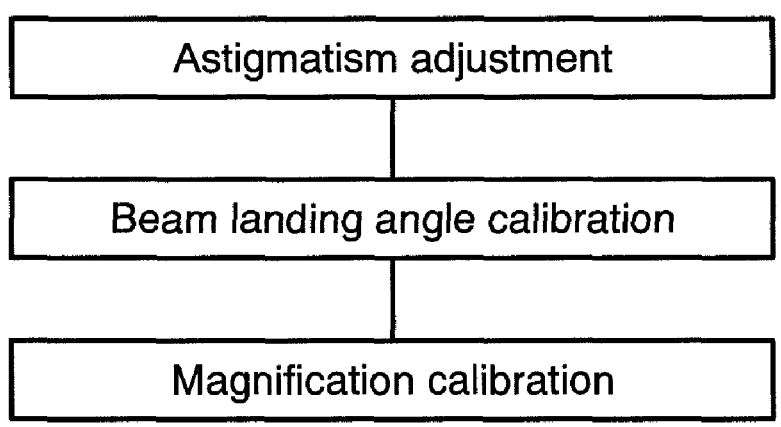

As a sample for calibration, in addition to the form of a wafer, a sample may have a form in which a fragment 705 of a sample for beam landing angle calibration is attached to a holder 703 on the sample stage 15 as shown in FIG. 17A. Attaching a sample 706 for automatic astigmatic adjustment and a sample 707 for magnification ratio calibration on the sample stage in addition to the above-mentioned sample and periodically performing a series of the process steps for optical system adjustment shown in FIG. 17B are useful to constantly maintain the best conditions of the SEM.

[Modification 6]

The following describes a user interface for beam landing angle calibration.

In order to automatically perform the flow chart shown in FIG. 1A, it is necessary to create in advance a file which specifies the size and arrangement of shot on a wafer, position of a pattern for calibration, acceleration voltage, beam current, magnification ratio, and other imaging conditions.

Figure 18:
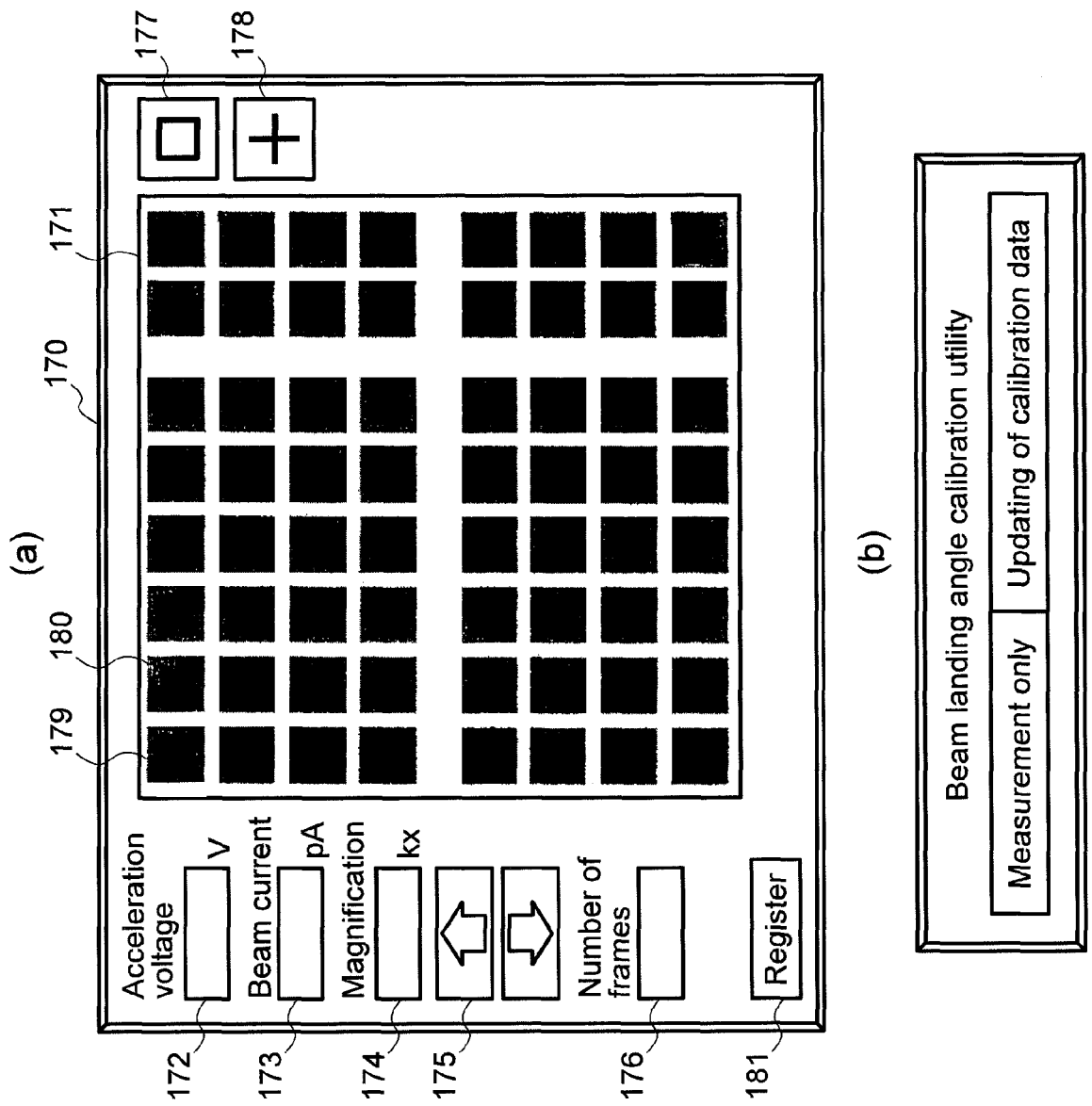
FIG. 18A is diagram showing example GUIs for setting conditions for automatically performing calibration of the beam landing angle.
FIG. 18B is a diagram showing buttons for selecting to perform only measurement of the beam landing angle is to be performed or perform updating of calibration data in addition to the measurement, which are displayed on the GUI screen for setting conditions in FIG. 18A.

FIGS. 18A and 18B show example GUI screens used to specify pyramids used for calibration. In FIG. 18A, Reference numeral 170 is a GUI screen. A low-power image 171 is acquired with an acceleration voltage specified in a box 172, a beam current specified in a box 173, a magnification ratio specified in a box 174, and the number of frame additions specified in a box 176. Reference numeral 175 is buttons for magnification ratio adjustment. Pyramids to be used are specified by use of a rectangle 177 or cross mark 178 on low-power images. In FIG. 18, three pyramids at the top left are specified by use of the crossing mark. High-power images of the pyramids specified here are acquired sequentially. Reference numeral 180 specifies the order of imaging, which is also a pyramid number. When imaging conditions and pyramids subjected to high-power imaging have been specified, the information is stored by use of a registration button 181. Although the example in FIG. 18A shows a configuration for setting all imaging conditions on the same screen, these setting items are not necessarily be displayed on the same screen but may be displayed on a plurality of screens.

Reference numeral 182 in FIG. 18B is buttons for selecting to perform only measurement of the beam landing angle (Steps 201 to 208 in FIG. 1) or perform updating of beam control parameters in addition of the measurement of the beam landing angle (Steps 201 to 210 in FIG. 1). These buttons are displayed together with the GUI 170 in FIG. 18A on the screen.

Figure 19:
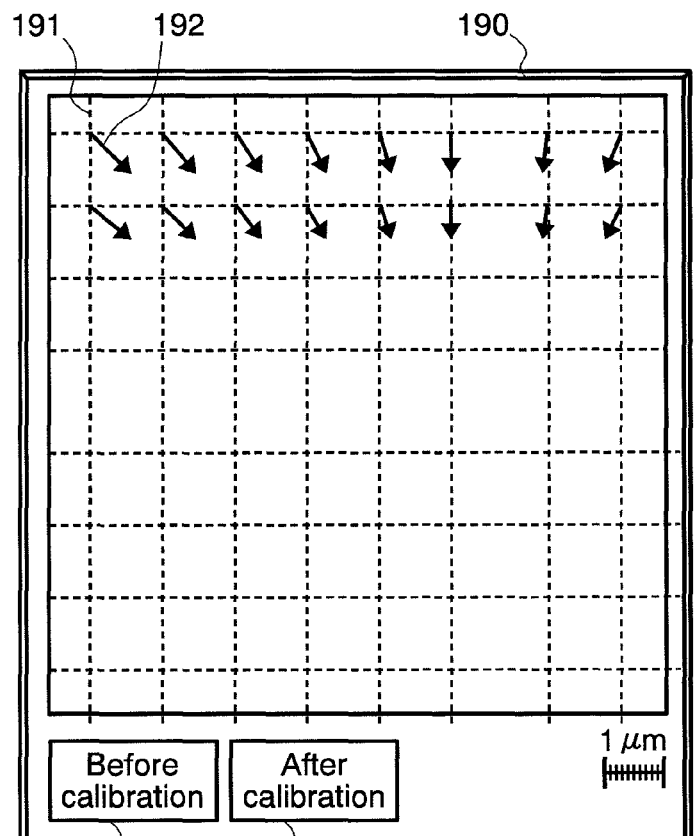
FIGS. 19A and 19B are diagrams showing example GUI screens for checking the results of calibration of the beam landing angle.

FIGS. 19A and 19B show example GUI screens for checking the results of beam landing angle calibration.

In FIG. 19A, reference numeral 190 is a screen which allows a user to understand the entire status of the beam landing angle. An intersection of dashed lines 191 corresponds to the position of each pyramid, and an arrow 192 indicates a beam landing angle with vector representation (not all arrows are shown in the diagram). The length of an arrow indicates the magnitude of the beam landing angle, and the direction of the arrow indicates the direction of the beam landing angle. For example, when the beam landing angle in the y direction is 0 degree, the arrow is horizontal. The results before and after calibration can be compared by switching between buttons 193 and 194. Reference numeral 195 in FIG. 19B is an example table of beam landing angles before and after calibration, displayed on the screen. The pyramid number is 180 specified in FIG. 18A. In FIG. 18A, there are 64 pyramids and therefore the pyramid number ranges from 1 to 64 if all the pyramids are specified to be measured.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for measuring distribution of beam landing angles with a viewing field by use of a charged particle beam apparatus, the method comprising the steps of:
    imaging a test sample with a first magnification ratio sufficient for including polyhedral patterns formed a test sample within a viewing field by applying a charged particle beam to the test sample and by detecting secondary electrons generated from the test sample, the polyhedral patterns having a known shape;
    imaging each polyhedral patterns with a second magnification ratio which is higher than the first magnification ratio by sequentially moving and applying the charged particle beam;
    obtaining first relationships between a position irradiated with the charged particle beam within the viewing filed and the beam landing angle for each the polyhedral patterns using images obtained during the step of imaging each polyhedral pattern; and
    obtaining second relationships between other positions within the viewing field and beam landing angles through interpolation.

2. The method for measuring distribution of beam landing angles with a viewing field by use of a charged particle beam apparatus as defined in claim 1, further comprising the step of:
    displaying the distribution of beam landing angles obtained by the first relationships and the second relationships on a screen.

3. The method for measuring distribution of beam landing angles with a viewing field by use of a charged particle beam apparatus as defined in claim 2,
    wherein lengths and directions of the beam landing angles are indicated by length and direction of arrow on the distribution.

4. The method for measuring distribution of beam landing angles with a viewing field by use of a charged particle beam apparatus as defined in claim 1,
    wherein the polyhedral pattern with the known shape on the test sample has a shape of a quadrangular pyramid, a quadrangular fustum, or an almost quadrangular pyramid with a round top surface.

5. A charged particle beam comprising:
    a charged particle beam irradiation means for applying a focused charged particle beam to a sample to scan the sample;
    an image capturing means for capturing images of the sample by detecting secondary charged particles generated from the sample irradiated with a charged particle beam emitted from the charged particle beam irradiation means with a first magnification ratio and a second magnification ratio, the second magnification ratio being higher than the first magnification ratio;
    an image processing means for processing images captured by the image capturing means, and for obtaining first relationship between positions irradiated with the charged particle beam within a viewing field and a beam landing angle in a plurality of directions for polyhedral patterns detected with the first magnification ratio, and obtaining second relationships between other positions within the viewing field and beam landing angles through interpolation; and
    a display means for displaying distribution of beam landing angles with the viewing field.

6. The charged particle beam apparatus as defined in claim 5, wherein the distribution of beam landing angles are obtained by the first relationship and the second relationship.

7. The charged particle beam apparatus as defined in claim 5, wherein the display means indicates lengths and directions of the beam landing angles by using length and direction of arrow on the distribution.

8. The charged particle beam apparatus as defined in claim 5, wherein a plurality of polyhedral patterns with a known shape of a quadrangular pyramid, a quadrangular fustum, or an almost quadrangular pyramid with a round top surface are formed on the test sample.

\* \* \* \* \*